(12) United States Patent
Sakuyama et al.

(10) Patent No.: US 8,740,047 B2
(45) Date of Patent: Jun. 3, 2014

(54) METHOD OF MANUFACTURING ELECTRONIC APPARATUS, ELECTRONIC COMPONENT-MOUNTING BOARD, AND METHOD OF MANUFACTURING THE SAME

(71) Applicant: Fujitsu Limited, Kawasaki (JP)

(72) Inventors: Seiki Sakuyama, Kawasaki (JP);
Toshiya Akamatsu, Kawasaki (JP);
Masateru Koide, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/023,608

(22) Filed: Sep. 11, 2013

(65) Prior Publication Data

US 2014/0008114 A1    Jan. 9, 2014

Related U.S. Application Data (60) Division of application No. 13/113,305, filed on May 23, 2011, now Pat. No. 8,556,157, which is a continuation of application No. PCT/JP2008/003534, filed on Nov. 28, 2008.

(51) Int. Cl.
*B23K 31/02* (2006.01)
*H01L 29/40* (2006.01)

(52) U.S. Cl.
USPC ............... 228/180.22; 257/737; 438/614

(58) Field of Classification Search
None
See application file for complete search history.

(56) References Cited

U.S. PATENT DOCUMENTS

| 4,878,611 | A |   | 11/1989 | LoVasco et al. |
|---|---|---|---|---|
| 5,269,453 | A | * | 12/1993 | Melton et al. ............ 228/180.22 |
| 5,570,274 | A | * | 10/1996 | Saito et al. .................... 361/784 |
| 5,611,481 | A |   | 3/1997 | Akamatsu et al. |
| 5,641,113 | A |   | 6/1997 | Somaki et al. |
| 6,550,665 | B1 |   | 4/2003 | Parrish et al. |
| 6,800,169 | B2 |   | 10/2004 | Liu et al. |
| 6,994,243 | B2 |   | 2/2006 | Milewski et al. |
| 7,384,863 | B2 |   | 6/2008 | Shibata |

(Continued)

FOREIGN PATENT DOCUMENTS

| JP | 63-306634 A | 12/1988 |
|---|---|---|
| JP | 7-509662 A | 10/1995 |

(Continued)

OTHER PUBLICATIONS

International Search Report of PCT/JP2008/003534, mailing date of Jan. 6, 2009.

(Continued)

*Primary Examiner* — Kiley Stoner
(74) *Attorney, Agent, or Firm* — Westerman, Hattori, Daniels & Adrian, LLP (57) ABSTRACT

A method of manufacturing an electronic apparatus including a first and a second components, includes: forming a first solder bump on one of the first component and the second component; forming a second solder bump on the other one of the first component and the second component; bringing the first solder bump into contact with the second solder bump at a temperature higher than the liquidus temperature of any of the first and the second solder bumps such that the first and the second solder bumps are fused together to form a solder joint of an alloy having a lower liquidus temperature than any of the first and the second solder bumps; and solidifying the solder joint between the first and the second component.

3 Claims, 8 Drawing Sheets

(56) References Cited

U.S. PATENT DOCUMENTS

| | | |
|---|---|---|
| 7,534,715 B2 | 5/2009 | Jadhav et al. |
| 7,554,201 B2 * | 6/2009 | Kang et al. .................... 257/772 |
| 2002/0102832 A1 * | 8/2002 | Miyata et al. ................. 438/612 |
| 2004/0155358 A1 * | 8/2004 | Iijima ........................... 257/778 |
| 2004/0209453 A1 | 10/2004 | Akamatsu et al. |
| 2006/0033214 A1 * | 2/2006 | Tomono ........................ 257/772 |
| 2006/0113681 A1 * | 6/2006 | Jeong et al. ................... 257/780 |
| 2007/0090171 A1 | 4/2007 | Ochiai et al. |
| 2009/0273914 A1 * | 11/2009 | Supriya et al. ................ 361/820 |

FOREIGN PATENT DOCUMENTS

| | | |
|---|---|---|
| JP | 8-17860 A | 1/1996 |
| JP | 08-031835 A | 2/1996 |
| JP | 10-041621 A | 2/1998 |
| JP | 10-294337 A | 11/1998 |
| JP | 11-186712 A | 7/1999 |
| JP | 2001-230537 A | 8/2001 |
| JP | 2004-119801 A | 4/2004 |
| JP | 2007-123354 A | 5/2007 |
| JP | 2007-208056 A | 8/2007 |
| WO | 94-27777 A1 | 12/1994 |

OTHER PUBLICATIONS

Japanese Office Action dated Jun. 25, 2013, issued in corresponding Japanese Patent Application No. 2010-540236, with English translation (5 pages).

* cited by examiner

FIG. 5A 51a  51b  51c  51d  100.00 μm/div

FIG. 5B 52  100.00 μm/div

FIG. 6A

| EXAMPLE | CIRCUIT BOARD | | | | SEMICONDUCTOR DEVICE | | | | AFTER FORMATION OF JOINT | |
|---|---|---|---|---|---|---|---|---|---|---|
| | COMPOSITION | LIQUIDUS TEMPERATURE (°C) | VOLUME OF SOLDER BUMP 13 (μm³) | METAL MASK | | COMPOSITION | LIQUIDUS TEMPERATURE (°C) | VOLUME OF SOLDER BUMP 25 (μm³) | COMPOSITION OF SOLDER JOINT 22 | INITIAL COAGULATION TEMPERATURE |
| | | | | FIRST TIME (APERTURE SIZE / THICKNESS) | SECOND TIME (APERTURE SIZE / THICKNESS) | | | | | |
| EXAMPLE 1 | 90Bi-Sn | 240 | 7×10⁵ | φ100 μm/30 μm | φ135 μm/85 μm | Sn-5Ag | 240 | 4.7×10⁵ | 59Bi-39Sn(-Ag) | 143°C |
| EXAMPLE 2 | 90Bi-Sn | 240 | 5×10⁵ | φ100 μm/30 μm | φ135 μm/55 μm | Sn-5Ag | 240 | 4.7×10⁵ | 52Bi-46Sn(-Ag) | 152°C |
| EXAMPLE 3 | 90Bi-Sn | 240 | 5×10⁵ | φ100 μm/30 μm | φ135 μm/55 μm | Sn-5Ag | 240 | 4×10⁵ | 55Bi-43Sn(-Ag) | 144°C |
| EXAMPLE 4 | 90Bi-Sn | 240 | 5×10⁵ | φ100 μm/30 μm | φ135 μm/55 μm | Sn-5Ag | 240 | 3.5×10⁵ | 58Bi-40Sn(-Ag) | 141°C |
| EXAMPLE 5 | 90Bi-Sn | 240 | 5×10⁵ | φ100 μm/30 μm | φ135 μm/55 μm | Sn-5Ag | 240 | 3×10⁵ | 61Bi-37Sn(-Ag) | 147°C |
| EXAMPLE 6 | 90Bi-Sn | 240 | 5×10⁵ | φ100 μm/30 μm | φ135 μm/55 μm | Sn-5Ag | 240 | 2.7×10⁵ | 63Bi-35Sn(-Ag) | 150°C |
| EXAMPLE 7 | 90Bi-Sn | 240 | 7×10⁵ | φ100 μm/30 μm | φ135 μm/85 μm | Sn-3.5Ag | 221 | 4.7×10⁵ | 59Bi-40Sn(-Ag) | 143°C |
| EXAMPLE 8 | 90Bi-Sn | 240 | 5×10⁵ | φ100 μm/30 μm | φ135 μm/55 μm | Sn-3.5Ag | 221 | 4.7×10⁵ | 52Bi-47Sn(-Ag) | 152°C |
| EXAMPLE 9 | 90Bi-Sn | 240 | 5×10⁵ | φ100 μm/30 μm | φ135 μm/55 μm | Sn-3.5Ag | 221 | 4×10⁵ | 55Bi-44Sn(-Ag) | 144°C |
| EXAMPLE 10 | 90Bi-Sn | 240 | 5×10⁵ | φ100 μm/30 μm | φ135 μm/55 μm | Sn-3.5Ag | 221 | 3.5×10⁵ | 58Bi-41Sn(-Ag) | 141°C |
| EXAMPLE 11 | 90Bi-Sn | 240 | 5×10⁵ | φ100 μm/30 μm | φ135 μm/55 μm | Sn-3.5Ag | 221 | 3×10⁵ | 60Bi-39Sn(-Ag) | 145°C |
| EXAMPLE 12 | 90Bi-Sn | 240 | 5×10⁵ | φ100 μm/30 μm | φ135 μm/55 μm | Sn-3.5Ag | 221 | 2.7×10⁵ | 63Bi-36Sn(-Ag) | 150°C |
| EXAMPLE 13 | 90Bi-Sn | 240 | 7×10⁵ | φ100 μm/30 μm | φ135 μm/85 μm | Sn-2Ag | 226 | 4.7×10⁵ | 59Bi-40Sn(-Ag) | 143°C |
| EXAMPLE 14 | 90Bi-Sn | 240 | 5×10⁵ | φ100 μm/30 μm | φ135 μm/55 μm | Sn-2Ag | 226 | 4.7×10⁵ | 52Bi-47Sn(-Ag) | 152°C |

FROM FIG. 6A

| | | | | | | | | |
|---|---|---|---|---|---|---|---|---|
| EXAMPLE 15 | 90Bi-Sn | 240 | 5×10⁵ | φ100 μm/30 μm | φ135 μm/55 μm | Sn-2Ag | 226 | 4×10⁵ | 56Bi-43Sn(-Ag) | 141°C |
| EXAMPLE 16 | 90Bi-Sn | 240 | 5×10⁵ | φ100 μm/30 μm | φ135 μm/55 μm | Sn-2Ag | 226 | 3.5×10⁵ | 59Bi-41Sn(-Ag) | 143°C |
| EXAMPLE 17 | 90Bi-Sn | 240 | 5×10⁵ | φ100 μm/30 μm | φ135 μm/55 μm | Sn-2Ag | 226 | 3×10⁵ | 62Bi-38Sn(-Ag) | 149°C |
| EXAMPLE 18 | 90Bi-Sn | 240 | 5×10⁵ | φ100 μm/30 μm | φ135 μm/55 μm | Sn-2Ag | 226 | 2.7×10⁵ | 64Bi-36Sn(-Ag) | 152°C |
| EXAMPLE 19 | 90Bi-Sn | 240 | 7×10⁵ | φ100 μm/30 μm | φ135 μm/85 μm | Sn-2Ag | 226 | 4.7×10⁵ | 59Bi-40Sn(-Cu) | 143°C |
| EXAMPLE 20 | 90Bi-Sn | 240 | 5×10⁵ | φ100 μm/30 μm | φ135 μm/55 μm | Sn-0.7Cu | 227 | 4.7×10⁵ | 52Bi-47Sn(-Cu) | 152°C |
| EXAMPLE 21 | 90Bi-Sn | 240 | 5×10⁵ | φ100 μm/30 μm | φ135 μm/55 μm | Sn-0.7Cu | 227 | 4×10⁵ | 56Bi-44Sn(-Cu) | 141°C |
| EXAMPLE 22 | 90Bi-Sn | 240 | 5×10⁵ | φ100 μm/30 μm | φ135 μm/55 μm | Sn-0.7Cu | 227 | 3.5×10⁵ | 59Bi-41Sn(-Cu) | 143°C |
| EXAMPLE 23 | 90Bi-Sn | 240 | 5×10⁵ | φ100 μm/30 μm | φ135 μm/55 μm | Sn-0.7Cu | 227 | 3×10⁵ | 62Bi-38Sn(-Cu) | 149°C |
| EXAMPLE 24 | 90Bi-Sn | 240 | 5×10⁵ | φ100 μm/30 μm | φ135 μm/55 μm | Sn-0.7Cu | 227 | 2.7×10⁵ | 64Bi-36Sn(-Cu) | 152°C |
| EXAMPLE 25 | 85Bi-Sn | 223 | 5×10⁵ | φ100 μm/30 μm | φ135 μm/55 μm | Sn-3.5Ag | 221 | 4.7×10⁵ | 49Bi-50Sn(-Ag) | 159°C |
| EXAMPLE 26 | 85Bi-Sn | 223 | 5×10⁵ | φ100 μm/30 μm | φ135 μm/55 μm | Sn-3.5Ag | 221 | 4×10⁵ | 52Bi-47Sn(-Ag) | 152°C |
| EXAMPLE 27 | 85Bi-Sn | 223 | 5×10⁵ | φ100 μm/30 μm | φ135 μm/55 μm | Sn-3.5Ag | 221 | 3.5×10⁵ | 55Bi-44Sn(-Ag) | 144°C |
| EXAMPLE 28 | 85Bi-Sn | 223 | 5×10⁵ | φ100 μm/30 μm | φ135 μm/55 μm | Sn-3.5Ag | 221 | 3×10⁵ | 60Bi-39Sn(-Ag) | 145°C |
| EXAMPLE 29 | 85Bi-Sn | 223 | 5×10⁵ | φ100 μm/30 μm | φ135 μm/55 μm | Sn-3.5Ag | 221 | 2.7×10⁵ | 63Bi-36Sn(-Ag) | 150°C |
| EXAMPLE 30 | 85Bi-Sn | 223 | 5×10⁵ | φ100 μm/30 μm | φ135 μm/55 μm | Sn-3.5Ag | 221 | 2.2×10⁵ | 59Bi-40Sn(-Ag) | 143°C |
| EXAMPLE 31 | 85Bi-Sn | 223 | 5×10⁵ | φ100 μm/30 μm | φ135 μm/55 μm | Sn-3.5Ag | 221 | 1.9×10⁵ | 65Bi-34Sn(-Ag) | 154°C |

FIG. 7

| EXAMPLE | CIRCUIT BOARD ||||||| SEMICONDUCTOR DEVICE |||| AFTER FORMATION OF JOINT ||
|---|---|---|---|---|---|---|---|---|---|---|---|---|---|
| | FIRST COMPOSITION | LIQUIDUS TEMPERATURE (°C) | VOLUME OF SOLDER BUMP 13 ($\mu m^3$) | METAL MASK ||| SECOND COMPOSITION | LIQUIDUS TEMPERATURE (°C) | VOLUME OF SOLDER LAYER 14 ($\mu m^3$) | METAL MASK (APERTURE SIZE/THICKNESS) | COMPOSITION | LIQUIDUS TEMPERATURE (°C) | VOLUME OF SOLDER BUMP 25 ($\mu m^3$) | COMPOSITION OF SOLDER JOINT 22 | INITIAL COAGULATION TEMPERATURE |
| | | | | FIRST TIME (APERTURE SIZE/THICKNESS) | SECOND TIME (APERTURE SIZE/THICKNESS) | | | | | | | | | |
| EXAMPLE 32 | 90Bi-Sn | 240 | 7×10⁵ | φ100 μm/30 μm | φ135 μm/80 μm | Sn-3.5Ag | 221 | 1.7×10⁵ | φ135 μm/25 μm | Sn-3.5Ag | 221 | 3.0×10⁵ | 59Bi-40Sn(-Ag) | 143°C |
| EXAMPLE 33 | 90Bi-Sn | 240 | 5×10⁵ | φ100 μm/30 μm | φ135 μm/55 μm | Sn-3.5Ag | 221 | 1.7×10⁵ | φ135 μm/25 μm | Sn-3.5Ag | 221 | 3.0×10⁵ | 52Bi-47Sn(-Ag) | 152°C |
| EXAMPLE 34 | 90Bi-Sn | 240 | 5×10⁵ | φ100 μm/30 μm | φ135 μm/55 μm | Sn-3.5Ag | 221 | 1.7×10⁵ | φ135 μm/25 μm | Sn-3.5Ag | 221 | 2.3×10⁵ | 55Bi-44Sn(-Ag) | 144°C |
| EXAMPLE 35 | 90Bi-Sn | 240 | 5×10⁵ | φ100 μm/30 μm | φ135 μm/55 μm | Sn-3.5Ag | 221 | 1.7×10⁵ | φ135 μm/25 μm | Sn-3.5Ag | 221 | 1.8×10⁵ | 58Bi-41Sn(-Ag) | 141°C |
| EXAMPLE 36 | 90Bi-Sn | 240 | 5×10⁵ | φ100 μm/30 μm | φ135 μm/55 μm | Sn-3.5Ag | 221 | 1.7×10⁵ | φ135 μm/25 μm | Sn-3.5Ag | 221 | 1.3×10⁵ | 60Bi-39Sn(-Ag) | 145°C |
| EXAMPLE 37 | 90Bi-Sn | 240 | 5×10⁵ | φ100 μm/30 μm | φ135 μm/55 μm | Sn-3.5Ag | 221 | 1.7×10⁵ | φ135 μm/25 μm | Sn-3.5Ag | 221 | 1.0×10⁵ | 63Bi-36Sn(-Ag) | 150°C |
| EXAMPLE 38 | 85Bi-Sn | 223 | 5×10⁵ | φ100 μm/30 μm | φ135 μm/55 μm | Sn-3.5Ag | 221 | 1.7×10⁵ | φ135 μm/25 μm | Sn-3.5Ag | 221 | 3.0×10⁵ | 49Bi-50Sn(-Ag) | 159°C |
| EXAMPLE 39 | 85Bi-Sn | 223 | 5×10⁵ | φ100 μm/30 μm | φ135 μm/55 μm | Sn-3.5Ag | 221 | 1.7×10⁵ | φ135 μm/25 μm | Sn-3.5Ag | 221 | 2.3×10⁵ | 52Bi-47Sn(-Ag) | 152°C |
| EXAMPLE 40 | 85Bi-Sn | 223 | 5×10⁵ | φ100 μm/30 μm | φ135 μm/55 μm | Sn-3.5Ag | 221 | 1.7×10⁵ | φ135 μm/25 μm | Sn-3.5Ag | 221 | 1.8×10⁵ | 55Bi-44Sn(-Ag) | 144°C |
| EXAMPLE 41 | 85Bi-Sn | 223 | 5×10⁵ | φ100 μm/30 μm | φ135 μm/55 μm | Sn-3.5Ag | 221 | 1.7×10⁵ | φ135 μm/25 μm | Sn-3.5Ag | 221 | 1.3×10⁵ | 60Bi-39Sn(-Ag) | 145°C |
| EXAMPLE 42 | 85Bi-Sn | 223 | 5×10⁵ | φ100 μm/30 μm | φ135 μm/55 μm | Sn-3.5Ag | 221 | 1.7×10⁵ | φ135 μm/25 μm | Sn-3.5Ag | 221 | 1.0×10⁵ | 63Bi-36Sn(-Ag) | 150°C |

US 8,740,047 B2

METHOD OF MANUFACTURING ELECTRONIC APPARATUS, ELECTRONIC COMPONENT-MOUNTING BOARD, AND METHOD OF MANUFACTURING THE SAME

CROSS-REFERENCE TO RELATED APPLICATION

This is a divisional application of U.S. application Ser. No. 13/113,305, filed May 23, 2011, now U.S. Pat. No. 8,556,157, which is a continuation of International Application No. PCT/JP2008/003534 filed on Nov. 28, 2008, the entire contents of which are incorporated herein by reference.

FIELD

The embodiment discussed herein is related to a method of manufacturing an electronic apparatus in which a plurality of components are bonded to each other through a solder bump.

BACKGROUND

In general, in the case where the processing speed and function of a large-scale integration (LSI) circuit are increased, the number of connection terminals of a semiconductor chip tends to correspondingly increase. A flip-chip mounting technique is employed as a connection technique, in which a solder bump formed on a semiconductor chip is utilized when the semiconductor chip faces downward. Examples of a material used to form the solder bump of a semiconductor chip include a tin (Sn)-silver (Ag) alloy, a tin-copper (Cu) alloy, and a tin-silver-copper alloy.

In the flip-chip mounting technique, a solder bump is generally formed on an electrode of a semiconductor chip as described above, while a solder alloy is supplied also onto an electrode of a circuit board on which the semiconductor chip is to be mounted. In general, the solder alloy to be supplied onto the electrode of the circuit board has a primary component that is the same as that of the solder bump that is formed on the semiconductor chip. Such an approach is employed for the following reasons: solder wettability is improved at the time of forming a solder bump connection, solder is supplied at a finer pitch in a sufficient amount, and high connection reliability is maintained.

In order to reduce production costs and provide a fine structure, a build-up substrate in which an organic material is used is employed as a circuit board. In the case where a semiconductor chip is bonded to a circuit board by using a material of the above solder bump, heat is applied at a high temperature higher than or equal to 250° C., for example. By virtue of such application of heat, the solder bump of the semiconductor chip is melted as well as that of the circuit board, and then the melted solder bumps are fused together. Subsequently, the resultant product is cooled to complete the bonding process.

In the cooling process, the state of a solder joint, which is formed as a result of fusing together the solder bumps, is changed from a liquid to a solid, and then the semiconductor chip is physically fixed to the circuit board. A circuit board that is produced by using an organic material exhibits a high thermal expansion coefficient that is in the range from 15 to 22 ppm/° C. In contrast, a semiconductor chip exhibits a low thermal expansion coefficient that is in the range from 3 to 5 ppm/° C. Therefore, during the cooling process to normal temperature (a process of changing a state of the solder from solidification to normal temperature), the semiconductor chip, circuit board, and solder joint are exposed to application of large stress due to differential thermal expansion. Such stress causes a significant problem of deterioration of quality, such as cracking of the semiconductor chip and damaging of the joint. Such a problem, which is caused by differential thermal expansion (stress) between the semiconductor chip and the circuit board, will come to have an increasingly significant influence in the future resulting from an increase in a device size due to the increased number of terminals of the semiconductor chip.

The usage of a low-melting-point solder has been suggested as an approach to overcome such a problem. Examples of the low-melting-point solder include Sn-58Bi solder having a melting point of 139° C. and Sn-52In solder having a melting point of 115° C. The usage of a low-melting-point solder serves as a technique for overcoming various problems due to the stress generated during the bonding process. However, usage of a low-melting-point solder in the semiconductor chips causes problems in that the solder is melted during a burn-in test of the semiconductor chip and in that the reliability with respect to electric properties may not be sufficiently evaluated.

The followings are reference documents:
[Document 1] Japanese Laid-open Patent Publication No. 10-41621
[Document 2] International Publication Pamphlet No. WO 94/027777
[Document 3] Japanese Laid-open Patent Publication No. 2007-208056

SUMMARY

According to an aspect of the embodiment, a method of manufacturing an electronic apparatus including a first component and a second component, includes: forming a first solder bump on one of the first component and the second component; forming a second solder bump on the other one of the first component and the second component; bringing the first solder bump into contact with the second solder bump at a temperature higher than the liquidus temperature of any of the first and the second solder bumps such that the first and the second solder bumps are fused together to form a solder joint of an alloy having a lower liquidus temperature than any of the first and the second solder bumps; and solidifying the solder joint between the first and the second component.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

FIGS. 1A to 1F are cross-sectional views each schematically illustrating a process of manufacturing a semiconductor device of an embodiment 1.

Figures 1A, 1B:
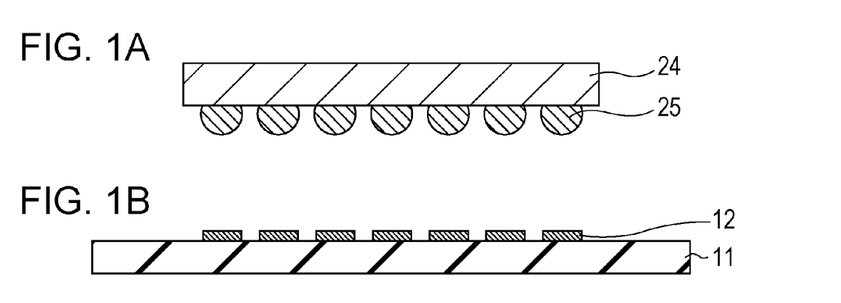
FIGS. 1A to 1F are cross-sectional views each schematically illustrating a process of manufacturing a semiconductor device of an embodiment 1.

First, as illustrated in FIG. 1A, a semiconductor chip 24 is prepared, and solder bumps 25 are formed on a surface of the semiconductor chip 24.

For example, a known semiconductor chip such as an LSI device is employed as the semiconductor chip 24. The semiconductor chip 24 has a thermal expansion coefficient of, for example, approximately $3\text{-}4\times10^{-6}\text{K}^{-1}$.

The solder bumps 25 are formed on a surface of the semiconductor chip 24. The solder bumps 25 are made of a Sn-based alloy. The Sn-based alloy herein refers to an alloy containing Sn in a weight ratio greater than 50 wt %. Examples of the alloy used for the solder bumps 25 include a Sn—Ag alloy, a Sn—Cu alloy, a Sn—Ag—Cu alloy, and a Sn—Bi alloy.

The composition of each of the solder bumps 25 is designed such that each of the solder bumps 25 has a liquidus temperature higher than that of a solder joint, which will be formed as a result of fusing together solder bumps 13 and the solder bump 25 in a subsequent process. The semiconductor chip 24 having a surface on which the solder bumps 25 have been formed is subjected to a reliability-evaluating test called a burn-in test. The burn-in test functions as a screening process in which temperature and voltage serve to accelerate deterioration in the quality of a semiconductor chip and in which a semiconductor chip having an initial failure is therefore preliminarily removed. In the burn-in test of the semiconductor chip 24, a temperature condition that is approximately in the range from 150 to 200° C. is generally employed. The solder bumps 25 made of solder having a melting point of higher than or equal to 210° C. are not melted in a burn-in test at a temperature of approximately 200° C. and are therefore preferably employed. Examples of a solder having a liquidus temperature higher than or equal to 210° C. include a Sn-3.5Ag alloy (solidification point: 221° C.), a Sn-0.7Cu alloy (solidification point: 227° C.), and a Sn-3Ag-0.5Cu alloy (solidification point: 217° C.). The number that is assigned to the front of a chemical symbol herein indicates a content ratio of such a chemical symbol in a solder. The content ratio for a chemical symbol not preceded by a number is the difference between the value of 100 and the sum of numbers that precede the remaining of chemical symbols. For example, in the Sn-3.5Ag alloy, the content ratio of Ag is 3.5 wt %, and the content ratio of Sn is 96.5 wt %. However, Sn may not be exactly contained in such an alloy in an amount of 96.5 wt %. For example, a composition may be employed, in which Sn is contained in the Sn-3.5Ag alloy in an amount less than 96.5 wt % and another element is contained as the remainder other than Ag and Sn in a small amount that is in the range from 0.01 to 1 wt %.

In order to improve the mechanical properties, such as strength and ductility, of the solder joint of a semiconductor device to be produced, the solder bumps 25 may further contain any element such as Au, Ag, Cu, Sb, Ni, Ge, or Zn in an amount that is in the range from 0.01 to 1 wt %. For example, the total volume of the solder bumps 25 formed on the semiconductor chip 24 is in the range from $1\times10^5$ to $6\times10^5$ μm$^3$. However, the volume of each of the solder bumps 25 may be appropriately adjusted on the basis of a connection pitch and a connection height.

A process of forming the semiconductor bumps 25 on a surface of the semiconductor chip 24 is the same as a process of forming the solder bumps 13 on electrodes 12, and such a process will be hereinafter described with reference to FIG. 1C.

Next, a semiconductor device mounting board 15 is prepared through the following procedures. Procedures of preparing the semiconductor device mounting board 15 will be described with reference to FIGS. 1B and 1C.

As illustrated in FIG. 1B, a circuit board 11 having a surface on which the electrodes 12 are provided is prepared.

An electric wire (not illustrated) is provided to the inside and/or a surface of the circuit board 11. Although a material of the circuit board 11 is not specifically limited, a material exhibiting high electric conductivity is employed to suppress leakage of a current that flows in the electric wire. Examples of a material exhibiting high electric conductivity include an organic resin such as an epoxy resin. A circuit board made of an organic resin has a relatively large thermal expansion coefficient that is approximately in the range from 15 to 20 ppm/K. Even if a highly conductive material is used for part of a substrate, the substrate may have a configuration in which a highly insulating material is provided between the electric wire and the highly conductive material.

The electrodes 12 are provided on the circuit substrate 11. Each of the electrodes 12 is electrically connected to the electric wire (not illustrated) provided to the circuit board 11. Any material which exhibits electrical conductivity is used for the electrodes 12, and a material having wettability to the solder bumps 13 that will be hereinafter described is preferably employed. Examples of the material used for the electrodes 12 include gold (Au), silver, copper, and nickel (Ni).

A technique by which the electrodes 12 are formed on a surface of the circuit board 11 is not specifically limited. A typical thin-film-forming technique may be used to form the electrodes 12 on a surface of the circuit board 11, and examples of such a technique include a film formation technique such as a sputtering or plating technique that is employed for manufacturing an integrated circuit, a patterning technique that utilizes a photolithographic method or an etching method, and a polishing technique such as a mechanical processing or polishing processing. A commercially available circuit board having a surface on which an electrode is formed may be prepared.

Figure 1C:
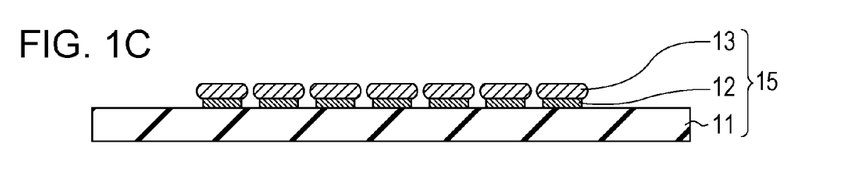

Next, as illustrated in FIG. 1C, the solder bumps 13 are formed on the electrodes 12, thereby producing the semiconductor device mounting board 15.

The solder bumps 13 are made of a Bi-based alloy. The Bi-based alloy herein refers to an alloy containing Bi in a weight ratio greater than 50 wt %. The liquidus temperature of each of the solder bumps 13 is substantially the same as that of each of the solder bumps 25. The liquidus temperatures of the solder bumps 25 and 13 have such a relationship, and therefore in the case where the solder bumps 13 and 25 are fused together in a subsequent process, materials of the solder bumps 13 and 25 are easily diffused. Accordingly, variation in the composition of the individual solder joints is decreased, the solder joints being produced as a result of fusing together the solder bumps 13 and 25.

The semiconductor chip 24 on which the solder bumps 25 have been provided is preliminarily subjected to a reliability test such as a burn-in test as described above, and therefore the composition of each of the solder bumps 13 and 25 is designed such that each of the solder bumps 13 and 25 has a liquidus temperature higher than that of the solder joints, the solder joint being formed as a result of fusing together the solder bumps 13 and 25.

Although the liquidus temperature of each of the solder bumps 13 is substantially the same as that of each of the solder bumps 25, both the liquidus temperatures may not be exactly the same. In the method of manufacturing the semiconductor device according to the embodiment, difference may be generated between the liquidus temperature of each of the solder bumps 13 and the liquidus temperature of each of the solder bumps 25 within temperature tolerance in a reflow conveyor and within temperature tolerance in liquidus temperature due to a variation in the compositions of the alloy, the reflow conveyor being used for bonding solder. The temperature tolerance in the reflow conveyor is ±20° C., preferably ±10° C., especially preferably ±5° C. The temperature tolerance due to the variation in the compositions of the alloy is in the range from ±3 to 5° C., for example, in a Bi—Sn alloy. In view of the above conditions, the tolerance range is determined as ±20° C. Within such a range of the temperature tolerance, a material used for each of the solder bumps may be selected in view of the mechanical properties and availability of a solder material.

For example, in the case where the semiconductor chip 24 is subjected to the burn-in test at a temperature of 200° C., solder having a liquidus temperature (initial solidification temperature) of higher than or equal to 210° C. is used for the solder bumps 25 as described above, such as the Sn-3.5Ag alloy (solidification point: 221° C.), the Sn-0.7Cu alloy (solidification point: 227° C.), and the Sn-3Ag-0.5Cu alloy (solidification point: 217° C.). In the case where the temperature tolerance in the reflow conveyor is ±20° C., the liquidus temperature of each of the solder bumps 13 corresponding to each of the solder bumps 25 made of a Sn-2.6Ag alloy (solidification point: 225° C.) is in the range from 205 to 245° C. For example, in each of the solder bumps 13 having a liquidus temperature that falls within such a range, a weight ratio of the Bi content is in the range from 85 to 90 wt %, and the weight ratio of the Sn content is in the range from 10 to 15 wt %.

In the case where the solder bumps 13 and 25 are fused together in a subsequent process, materials used for the solder bumps 13 and 25 are easily diffused. Therefore, the solder bumps 13 preferably contain Sn in a larger amount.

In order to improve the mechanical properties, such as strength and ductility, of the solder joint of a semiconductor device to be produced, the solder bumps 13 may further contain any element such as Au, Ag, Cu, Sb, Ni, Ge, or Zn in an amount that is in the range from 0.01 to 1 wt %. In addition, the content of an element having a large a ray dose, such as Pb, in the solder bumps 13 is preferably decreased, the a ray causing a soft error.

Although the technique of forming the solder bumps 13 on the electrodes 12 is not specifically limited, such a technique is appropriately selected from, for example, a technique in which a solder ball having a preliminarily adjusted composition is supplied by using flux and in which a joint is then formed, a technique in which solder paste made of a mixture of solder powder having a preliminarily adjusted composition and resin content containing a flux is supplied onto electrodes in the manner of printing, a plating technique, and a metal-jet technique. In particular, in the supplying technique utilizing printing, solder powder is mixed with flux resin content to obtain solder paste with the result that solder may be easily supplied onto electrodes, and therefore such a technique is preferably employed.

In the case where the solder paste-printing process is employed to form the solder bumps 13, solder paste is obtained as a result of mixing powder with flux, the powder being produced from solder through a disk atomization process so as to have a particle size of less than or equal to 20 μm, the solder is prepared so as to have the above composition. For example, the solder is contained in a mixture ratio of 90 wt %, and the flux is contained in a mixture ratio of 10 wt %.

The flux is prepared using base components including rosin, a solvent, an activator, and a thixotropic agent. Natural rosin or polymerized rosin may be appropriately selected as the rosin component. A solvent which is adequate for high-melting-point solder and which has a relatively high boiling point is utilized as the solvent component. For example, butyl carbitol or benzyl benzoate may be used as the solvent component. Any of halogen-based, organic acid-based, and amine-based activators may be selected as the activator component. Hydrogenated castor oil or the like may be used as the thixotropic agent. In view of printability and pot life, appropriate flux components may be employed depending on conditions. In addition, an epoxy resin may be employed in place of rosin.

In the supplying of the solder paste through printing, a metal mask is used, and the metal mask has apertures at positions corresponding to the position of the electrodes 12 formed on the circuit board 11. The aperture size and thickness of the metal mask is adjusted, thereby being able to control an amount in which the solder paste is supplied. After the solder paste has been supplied onto the electrodes 12, the solder paste is heated to be melted by using, for example, a warm air-heating-type nitrogen reflow conveyor furnace.

In the case of supplying the solder paste through printing, metal masks individually having different aperture sizes may be used to supply the solder paste onto the electrodes 12 through several printing steps, thereby precisely and steadily supplying the solder paste. For example, in the case where the solder paste is supplied onto the electrodes 12 through two printing steps, a metal mask having an aperture size of ϕ100 μm and having a thickness of 30 μm may be used in the first printing step, and a metal mask having an aperture size of 135 μm and having a thickness of 80 μm may be used in the second printing step. In the printing in the first printing step, the solder paste is supplied onto the electrodes 12, and then the solder paste is heated to be melted in a warm air-heating-type nitrogen reflow conveyor furnace and is subsequently cooled to normal temperature. Subsequently, the metal mask prepared for the second printing step is used to supply the solder paste onto the solder that has been provided on the electrodes 12 in the first printing step, and the solder is heated and fused as in the case of the first printing step, thereby providing solder on the semiconductor device mounting board 15. As in the case where the first printing step has been completed, the solder is heated to be melted in the warm air-heating-type nitrogen reflow conveyor furnace and is then cooled to normal temperature. For example, the total volume of the solder bumps 13 formed on the electrodes 12 is in the range from $4 \times 10^5$ to $8 \times 10^5$ μm$^3$.

In this case, after the solder bumps 13 have been formed on the electrodes 12, the tops of the solder bumps 13 are planarized by using a pressing machine, thereby being able to suppress misalignment of the semiconductor chip to be mounted.

Figure 1D:
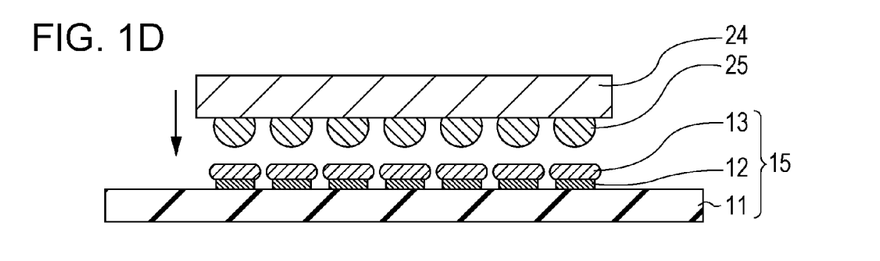
Figure 1E:
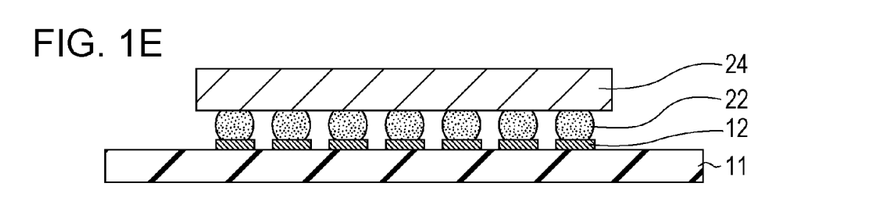

Then, as illustrated in FIG. 1D, the solder bumps 13 formed on the electrodes 12 are aligned with the solder bumps 25 formed on the semiconductor chip 24, thereby forming contacts. Subsequently, the resultant product is heated at a temperature at which the solder bumps 13 and 25 are both melted. Then, as illustrated in FIG. 1E, the solder bumps 13 and 25 are melted and fused together, thereby forming solder joints 22. For example, the solder bumps 25 formed on the semiconductor chip 24 and the solder bumps 13 formed on the electrodes 12 provided on the circuit board 11 each have a high melting temperature higher than or equal to 200° C. The solder components of the solder bumps 13 and 25 have substantially similar liquidus temperatures (initial solidification temperature) and are therefore diffused so as to flow into each other in a short time period during a thermal fusion-joint process. Accordingly, the solder joints 22 each having a chemical composition which enables solidification at a low temperature may be spontaneously formed. Partially defective diffusion of the solder components of the solder bumps 13 and 25 is suppressed, and such defectively diffused solder components are less likely to remain in the vicinity of the solder joints 22. Therefore, increase in the liquidus temperature (initial solidification temperature), which results from the different compositions of the solder joints 22 formed through the fusing process, is less likely to occur. For example, each of the solder joints 22 formed through the fusing process has a liquidus temperature (initial solidification temperature) of lower than or equal to 170° C.

The solder bumps 13 and 25 have substantially similar liquidus temperatures, and therefore the solder bumps 13 and 25 may be fused together without unnecessarily increasing the temperatures of the solder bumps 13 and 25 when the solder bumps 13 and 25 are fused together in a subsequent process. In terms of this advantage, the reliability of the circuit board 11 and semiconductor chip 24 in terms of the electrical properties is increased, and therefore the reliability of the semiconductor device to be produced in terms of the electrical properties is increased.

Each of the solder joints 22 contains Bi and Sn and contains solder having a nearly eutectic composition. In this case, the nearly eutectic composition refers to solder having a composition adjacent to a eutectic composition as well as a eutectic composition of Sn-58Bi. Examples of the solder having the nearly eutectic composition include an alloy containing Bi in an amount that is in the range from 45 to 65 wt % and containing Sn in an amount that is in the range from 55 to 35 wt %.

Figure 2:
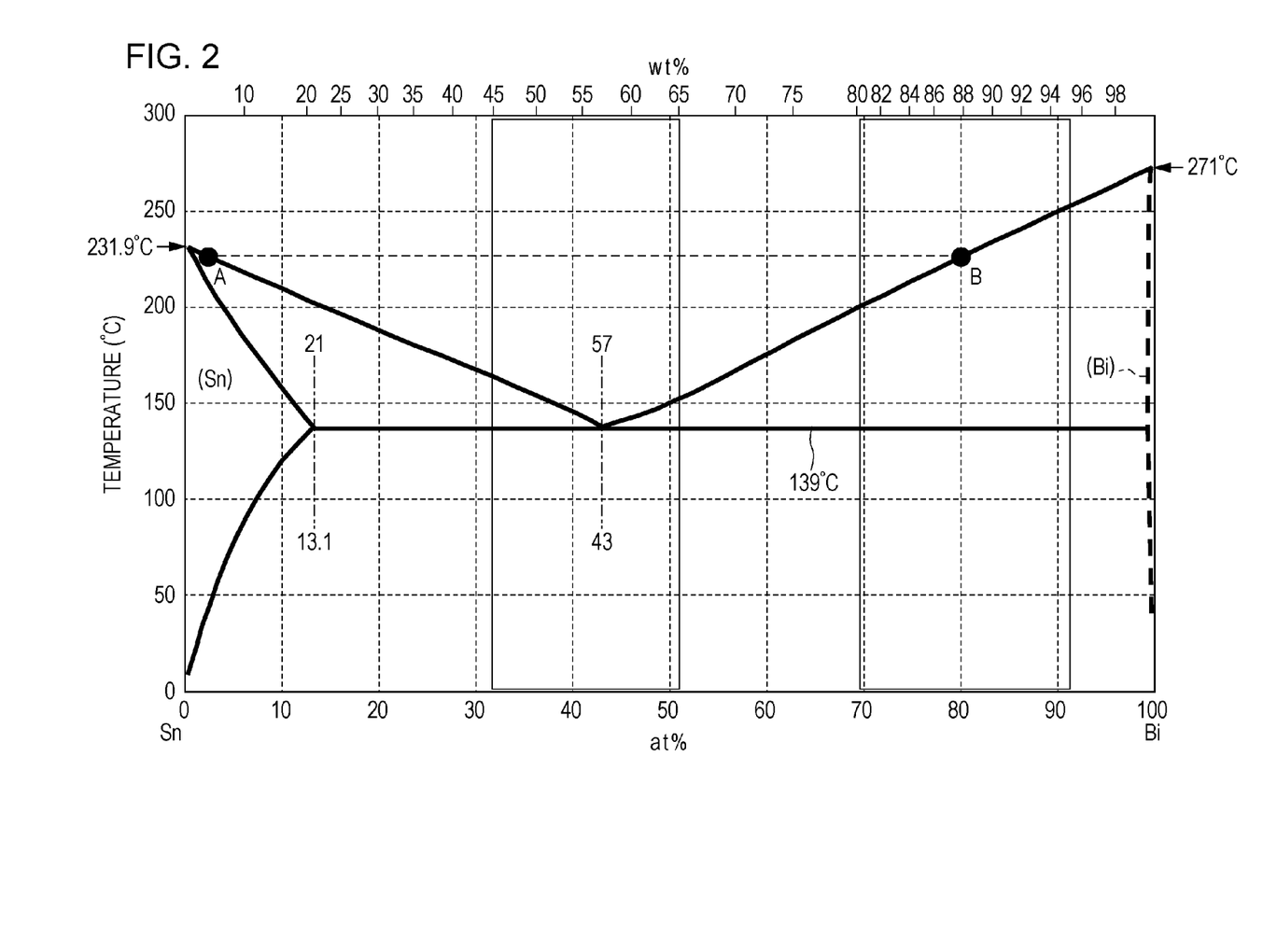
FIG. 2 is a phase diagram illustrating the phase of Bi—Sn solder.

FIG. 2 is a phase diagram illustrating the phase of the Bi—Sn solder. In the drawing, the longitudinal axis indicates the temperature (° C.) of the Bi—Sn solder, the lower lateral axis indicates atomic weight ratios (at %) of Sn, and the upper lateral axis indicates weight ratios (wt %) of Sn. For example, a Sn-5Bi alloy may be used to form the solder bumps 13, and a Sn-88Bi alloy may be used to form the solder bumps 25. The liquidus temperatures of the Sn-5Bi alloy and Sn-88Bi alloy are respectively indicated by points A and B in FIG. 2 and are each approximately 230° C. The volumes of the solder bumps 13 and 25 having such compositions are individually adjusted. Accordingly, the solder bumps 13 and 25 are then fused together, thereby producing the solder joints 22 formed by using an alloy containing Bi in an amount that is in the range from 45 to 65 wt % and containing Sn in an amount that is in the range from 55 to 35 wt %. Each of the solder joints 22 having such a composition has a solidification temperature lower than or equal to 170° C.

Then, the solder joints 22 are cooled, thereby solidifying. The electric wire of the circuit board 11 is electrically connected to the electrodes 12 through the solder joints 22. In the middle of the cooling process, in the case where temperature is decreased to a level lower than the liquidus temperature (initial solidification temperature) of the alloy that is used to form the solder joints 22, the solder joints 22 begin to be partially separated as a solid. The temperature is further decreased, and then the strength of fixing the circuit board 11 to the semiconductor chip 24 is gradually increased. Accordingly, stress applied to the circuit board 11 and the semiconductor chip 24 is gradually increased resulting from the difference in the thermal expansion coefficients of the circuit board 11 and semiconductor chip 24. In the case where the temperature is further decreased and then reaches the eutectic temperature of the alloy that is used to form the solder joints 22, the liquid part of each of the solder joints 22 is changed into a solid having a eutectic composition. Accordingly, the circuit board 11 is tightly fixed to the semiconductor chip 24. The temperature is further decreased, and the closer the temperature approaches normal temperature, the larger the stress applied to the circuit board 11, semiconductor chip 24, and solder joints 22 becomes. Each of the solder joints 22 has a liquidus temperature smaller than those of the solder bumps 13 and 25. Stress that is applied to the circuit board 11, semiconductor chip 24, and solder joints 22 included in a semiconductor device to be produced is suppressed. Accordingly, such suppression of stress contributes to improvement of reliability of the electric properties of a semiconductor device.

Figure 1F:
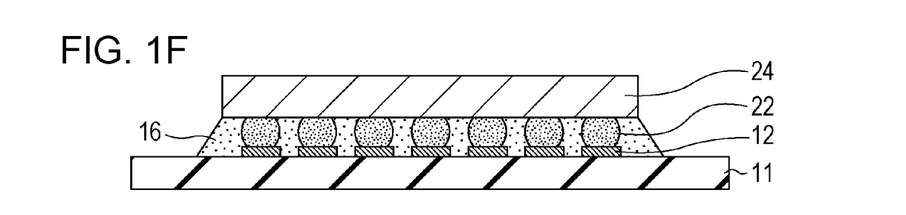

Finally, as illustrated in FIG. 1F, an underfill adhesive 16 is provided between the semiconductor chip 24 and the circuit board 11, thereby completing production of the semiconductor device of the embodiment. The underfill adhesive 16 is provided to fix the semiconductor chip 24 onto the circuit board 11 and is provided so as to fill gaps between individual solder joints 22. Any material which enables the semiconductor chip 24 to be fixed to the circuit board 11 may be used for the underfill adhesive 16. Examples of such a material include adhesives such as an epoxy resin and urethane resin.

In the semiconductor device produced in the embodiment, the material such as the Sn-3.5Ag alloy (solidification temperature: 221° C.), the Sn-0.7Cu alloy (solidification temperature: 227° C.), or the Sn-3Ag-0.5Cu alloy (solidification temperature: 217° C.) is employed, and the stress that is applied to the semiconductor chip during the joint-forming process may be therefore decreased to a level of less than or equal to 60% relative to a stress generated in a semiconductor device in which a substrate is bonded to a semiconductor chip through a typical solder joint.

Each of the solder joints 22 of the embodiment contains Bi in an amount that is in the range from 45 to 65 wt %, contains Sn in an amount that is in the range from 55 to 35 wt %, and has a liquidus temperature lower than or equal to 170° C. However, in a semiconductor device that is produced by the method of manufacturing a semiconductor device according to the embodiment, the Bi composition of each of solder joints 22 is not limited to such a level. For example, a material used to form the solder joints 22 may have an initial solidification temperature lower than those of the solder bumps 13 and 25 that are not still bonded. The respective materials used to form the solder bumps 13 and 25 may be replaced with each other.

FIGS. 3A to 3E are cross-sectional views each schematically illustrating a process of manufacturing a semiconductor device of an embodiment 2. The same description as made in the embodiment 1 is omitted.

Figure 3A:
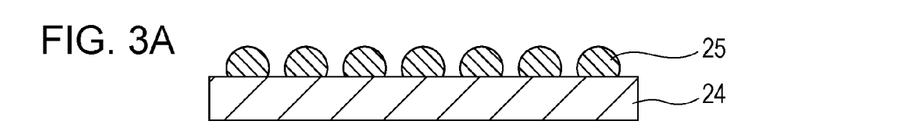
FIGS. 3A to 3E are cross-sectional views each schematically illustrating a process of manufacturing a semiconductor device of an embodiment 2.
Figure 3B:
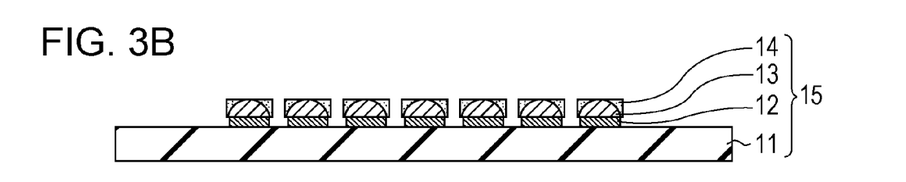

First, as illustrated in FIG. 3A, the solder bumps 25 are formed on the semiconductor chip 24. Then, as illustrated in FIG. 3B, the electrodes 12 are formed on the circuit board 11, and the solder bumps 13 and solder layers 14 are formed on the electrodes 12 in sequence. Subsequently, the top of each of the solder layers 14 is planarized, thereby producing the semiconductor device mounting board 15. The semiconductor chip 24, solder bumps 25, circuit board 11, electrodes 12, and solder bumps 13 are configured in the same manner as employed in the embodiment 1.

The solder layers 14 are made of a Sn-based alloy. The Sn-based alloy contains Sn in a weight ratio greater than 50 wt %. The top of each of the solder layers 14 is pressed, thereby being able to produce a substantially planarized top that is free from cracking and distortion. Because the top is substantially planarized, an area in which the solder bumps 13 contact the solder bumps 25 is increased in the case where the bumps 13 are aligned with the solder bumps 25 in a subsequent process, the solder bumps 13 individually having the solder layers 14 formed thereon. Accordingly, solder bumps 13 and 25 are easily bonded to each other. Because the top of each of the solder layers 14 is substantially planarized, each of the solder layers 14 is preferably made of a solder alloy containing Sn in an amount greater than or equal to 90 wt %. In the pressing process of the solder layers 14, a commercially available pressing machine may be used.

Although the tops of the solder bumps 13 may be pressed to be planarized without the formation of the solder layers 14, the solder bumps 13 primarily containing Bi are hard and are therefore fragile. Accordingly, the planarized top of each of the solder bumps 13 may have a distorted shape such as an elliptical shape and may be cracked. In this case, in the case where the solder bumps 13 are aligned with the solder bumps 25 in a subsequent process, it becomes difficult to contact the solder bumps 13 to the solder bumps 25.

The liquidus temperature of each of the solder layers 14 is substantially the same as that of each of the solder bumps 13 and 25. Therefore, in the case where the solder bumps 13 and 25 and solder layers 14 are fused together in a subsequent process, materials of the solder bumps 13 and 25 and solder layers 14 are easily diffused. Accordingly, a variation in the compositions of solder joints is decreased, the solder joints being produced as a result of fusing together the solder bumps 13 and 25 and solder layers 14.

Figure 4:
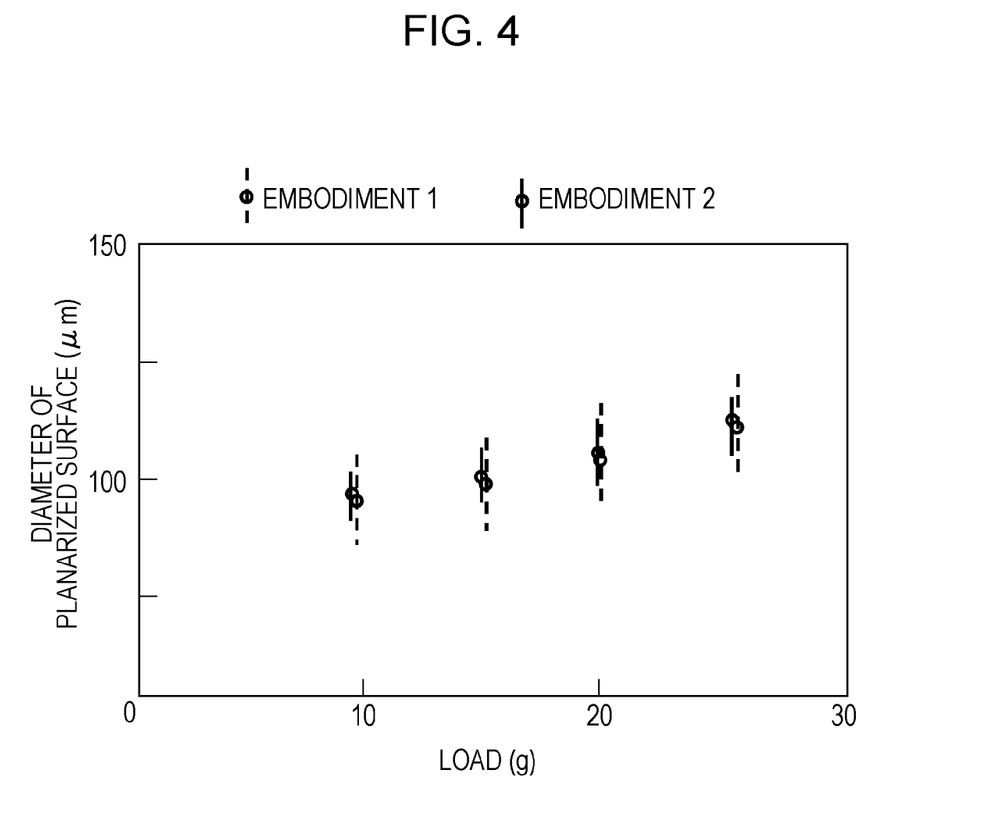
FIG. 4 illustrates diameters of planarized surfaces and the variation range thereof, the planarized surfaces being formed as a result of planarizing the tops of solder bumps with a pressing machine.

FIG. 4 illustrates diameters of planarized surfaces and the variation range thereof, the planarized surfaces being formed as a result of individually planarizing the tops of the solder bumps 13 of the embodiment 1 and the tops of the solder layers 14 by using a pressing machine, and the solder layers 14 being formed on the solder bumps 13 of the embodiment 2. In FIG. 4, the lateral axis indicates a load (g) per a single solder bump, and the longitudinal axis indicates the diameter of the planarized surface. The number of samples to be employed is 40. It is found that the embodiment 2 has a smaller variation in the diameters of the planarized surfaces relative to that of the embodiment 1.

Figure 5A:
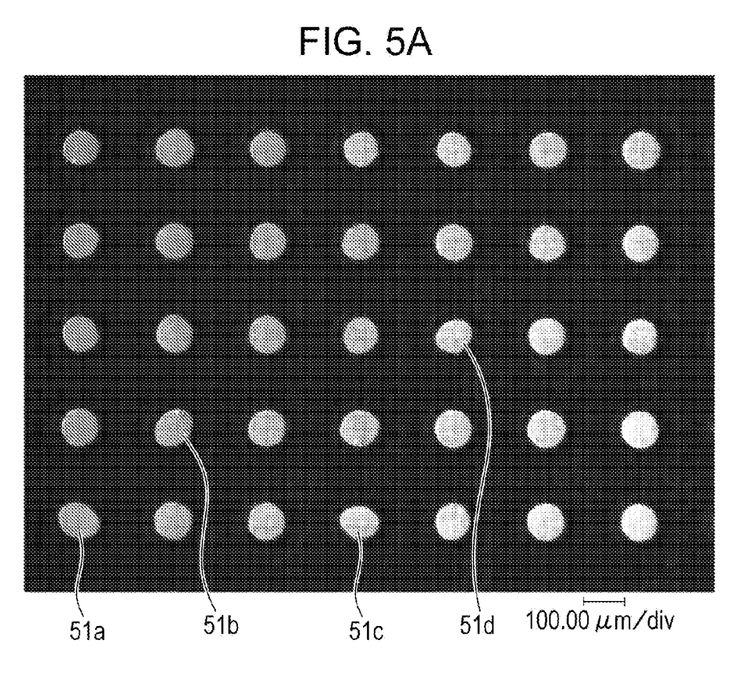
FIGS. 5A and 5B are photographs of the planarized top of the solder bumps.
Figure 5B:
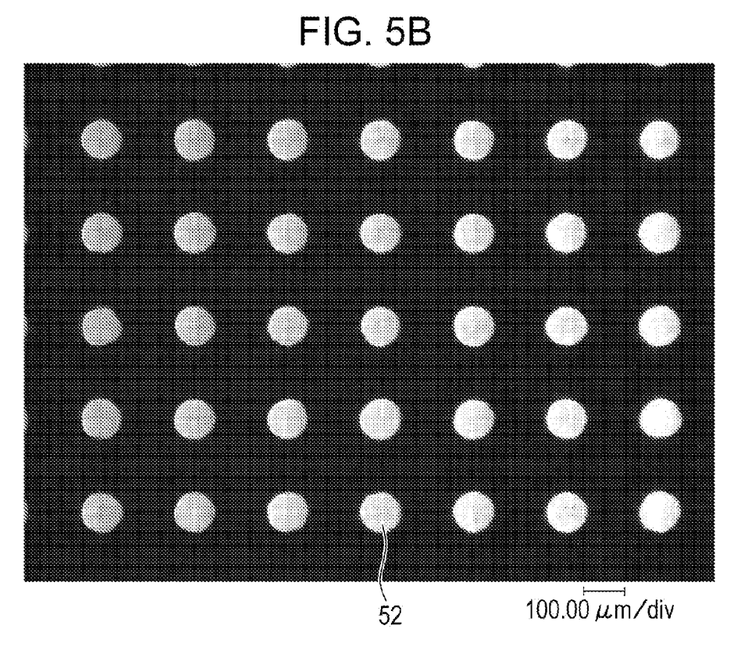

FIGS. 5A and 5B are photographs of the planarized tops of the solder bumps formed so as to overlie the circuit board. In FIG. 5A, the image of the tops of the solder bumps 13 of the embodiment 1 are provided. In FIG. 5B, the tops of the solder layers 14 of the embodiment 2 are provided. In the embodiments 1 and 2, circuit boards and electrodes that have been used have the same configurations, the electrodes being formed on the circuit boards. In FIG. 5A, white portions (35 in total) individually indicate tops 51 of the solder bumps 13. For example, it is found that tops 51a to 51d of the solder bumps 13 have distorted shapes. In FIG. 5B, white portions (35 in total) individually indicate tops 52 of the solder layers 14 formed on the solder bumps 13. As compared with the tops 51a to 51d of the solder bumps 13, it is found that the tops 52 have less distorted shapes and have circular shapes.

As described in the embodiment 1, reliability of the semiconductor chip 24 on which the solder bumps 25 have been formed is preliminarily tested. Accordingly, the compositions of the solder bumps 13, solder layers 14, and solder bumps 25 are designed such that the solder bumps 13, solder layers 14, and solder bumps 25 have liquidus temperatures larger than those of the solder joints 22, the solder joints 22 being formed as a result of fusing together the materials of the solder bumps 13 and 25 and solder layers 14.

For example, the total volume of the solder layers 14 formed on the solder bumps 13 is in the range from $1 \times 10^5$ to $2 \times 10^5$ μm3. However, such a total volume is required to be appropriately determined depending on the total volume of the solder bumps 13 and 25.

Figure 3C:
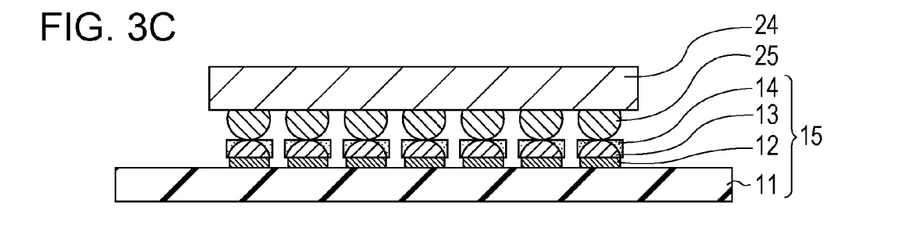
Figure 3D:
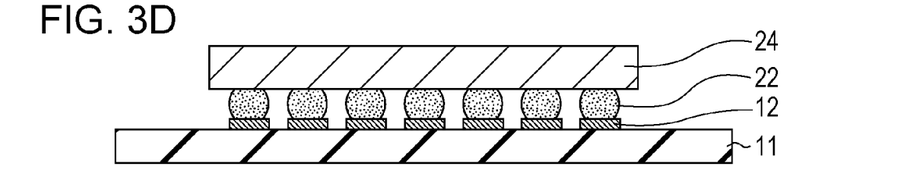

Next, as illustrated in FIG. 3C, the solder layers 14 are aligned with the solder bumps 25, and then the solder layers 14 are brought into contact with the solder bumps 25, the solder layers 14 being formed so as to overlie the electrodes 12, and the solder bumps 25 being formed on the semiconductor chip 24. Subsequently, heat is applied at a temperature at which the solder bumps 13, solder layers 14, and solder bumps 25 are melted. Then, as illustrated in FIG. 3D, the solder bumps 13, solder layers 14, and solder bumps 25 are fused together, thereby forming the solder joints 22.

The solder bumps 13, solder layers 14, and solder bumps 25 have substantially similar liquidus temperatures (initial solidification temperature), and the solder materials are therefore diffused so as to flow into each other in a short time period during a thermal fusion-joint process. Accordingly, the solder joints 22 each having a chemical composition which enables solidification at a low temperature may be spontaneously formed. Partially defective diffusion of the solder components of the solder bumps 13, solder layers 14, and solder bumps 25 is suppressed, and such defectively diffused solder components are less likely to remain in the vicinity of the solder joints 22. Therefore, increase in the liquidus temperature (initial solidification temperature), which results from the different compositions of the solder joints 22 formed through the fusing process, is less likely to occur. For example, each of the solder joints 22 formed through the fusing process has a liquidus temperature (initial solidification temperature) of lower than or equal to 170° C.

The solder bumps 13, solder layers 14, and solder bumps 25 have substantially similar liquidus temperatures, and therefore in the case where such members are fused together in a subsequent process, such members may be fused without excessively increased temperature. In view of this standpoint, reliability of the circuit board 11 and semiconductor chip 24 in view of the electrical properties is increased, and therefore reliability of a semiconductor device to be produced in view of the electrical properties is increased.

The solder joints 22 to be formed have the same configurations as employed in the embodiment 1, and therefore the description thereof is omitted.

Subsequently, the solder joints 22 are cooled to be solidified. The cooling is performed as in the case of the embodiment 1, and therefore the description thereof is omitted.

Figure 3E:
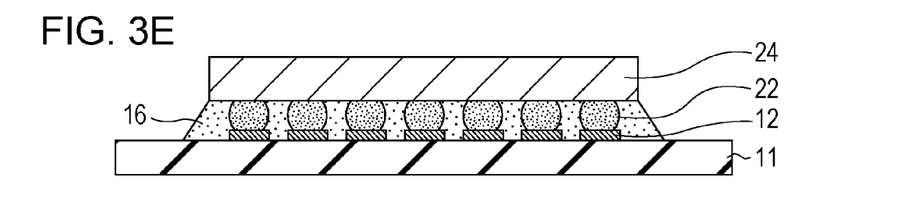

Finally, as illustrated in FIG. 3E, the underfill adhesive 16 is provided to a gap between the semiconductor chip 24 and the circuit board 11, thereby producing a semiconductor device of the embodiment. The same under fill adhesive 16 as employed in the embodiment 1 is used, and therefore the description thereof is omitted.

Embodiments of the invention are not limited to the above embodiments. The above embodiments have been described as examples. Any change and modification which have configurations that does not substantially depart from spirits of the invention and which provide similar advantages are considered to fall within the scope of the invention.

In embodiments of the invention, a primary component and a secondary component are not respectively limited to the circuit board and semiconductor chip. In another embodiment, one circuit board may be used as the primary component, and another circuit board having a thermal expansion coefficient smaller than that of the one circuit board may be used as the secondary component. The reliability test such as a burn-in test may be also performed to a circuit board.

EXAMPLES

Example 1

In accordance with the method described in the embodiment 1, a semiconductor device of an example 1 was produced so as to have the configuration of FIG. 1E.

First, the semiconductor chip 24 on which the solder bumps 25 had been formed was prepared. A Sn-5Ag (liquidus temperature: 240° C.) alloy was used as a solder to form the solder bumps 25. The semiconductor chip 24 had a thermal expansion coefficient of $4K^{-1}$.

Subsequently, the semiconductor device mounting board 15 was formed. The circuit board 11 on which the electrodes 12 had been provided was prepared. The circuit board 11 had a size of 45×45 mm and had a thickness of 1.2 mm. The electrodes 12 were provided in the number of 2000 and were provided so as to secure a pitch of 200 µm and so as to have a size of ϕ80 µm. The circuit board 11 had a thermal expansion coefficient of $17K^{-1}$. Solder resist was formed on a surface of the circuit board 11 to form a pattern of the electrodes 12 and had a thickness of approximately 25 µm. Then, the solder bumps 13 were formed on surfaces of the electrodes 12. A 90Bi—Sn alloy (liquidus temperature: 240° C.) was used as a solder to form the solder bumps 13. The solder was supplied onto the electrodes 12 by a solder paste-printing technique. The solder paste to be used was produced through mixing the solder alloy, powder, and a flux resin content with each other, the solder alloy being prepared so as to have a desired composition, the powder being prepared through a disk atomization process such that powder particles had diameters of smaller than or equal to 20 µm, and the flux resin content being produced through mixing polymerized rosin, benzyl benzoate as a solvent, succinic anhydride as an activator, and castor wax as a thixotropic agent with each other. The mixture ratio of the solder was 90 wt %, and the mixture ratio of the flux resin content was 10 wt %. A metal mask was used for printing, the metal mask having apertures that had been preliminarily formed at positions corresponding to the positions of the electrodes 12 of the circuit board 11. The aperture size and thickness of the metal mask was adjusted, thereby being able to control an amount of the paste to be supplied. In this example, in order to precisely and steadily supply the paste, metal masks individually having different aperture sizes were used, and solder was supplied through printing of two steps. A metal mask used in the first step had an aperture size of ϕ100 µm and had a thickness of 30 µm. A metal mask used in the second step had an aperture size of ϕ135 µm and had a thickness of 85 µm. In the first printing step, the solder paste was supplied onto the electrodes 12 of the circuit board 11 and was then heated to be melted in a warm air-heating-type nitrogen reflow conveyor furnace (temperature tolerance ±20° C.) at a temperature of 260° C. Then, the metal mask prepared for the second printing step was used to again supply the solder paste onto the solder which had been supplied onto the circuit board 11 in the first printing step. The resultant product was heated to be melted as in the case of the first printing step, thereby forming the solder bumps 13 on the circuit board 11. The solder was supplied in the total amount of $7 \times 10^5$ µm³. Then, the pressing machine was used to apply pressure, thereby substantially planarizing the top of each of the bumps 13 formed on the circuit board 11. The pressing was performed at normal temperature with strength of 30 kg/2000 bumps. After the pressing had been performed, each of the solder bumps 13 had a height of 15 µm, and the planarized top had a diameter of approximately 100 µm.

Subsequently, flux was applied onto the top of each of the solder bumps 25 formed on the semiconductor chip 24 in an adequate amount, and then a flip-chip bonder was used to align the semiconductor chip 24 with the circuit board 11. Then, the semiconductor chip 24 was mounted on the circuit board 11. Subsequently, the resultant product was heated at a temperature of 260° C. in the nitrogen reflow conveyor furnace. Then, the heated product was cooled to normal temperature, and it was finally confirmed that the solder joints 22 were formed with good quality.

The solder joints 22 were sampled, and the composition of the sample was measured through an inductively-coupled plasma atomic emission spectrometry (ICP-AES) with the result that it was confirmed that a junction containing Bi of 59 wt % and containing Sn and Ag as residual portion was formed. Furthermore, through a differential scanning calorimetry (DSC), it was confirmed that the junction had an initial solidification temperature of 143° C.

Examples 2 to 24

Figure 6A:
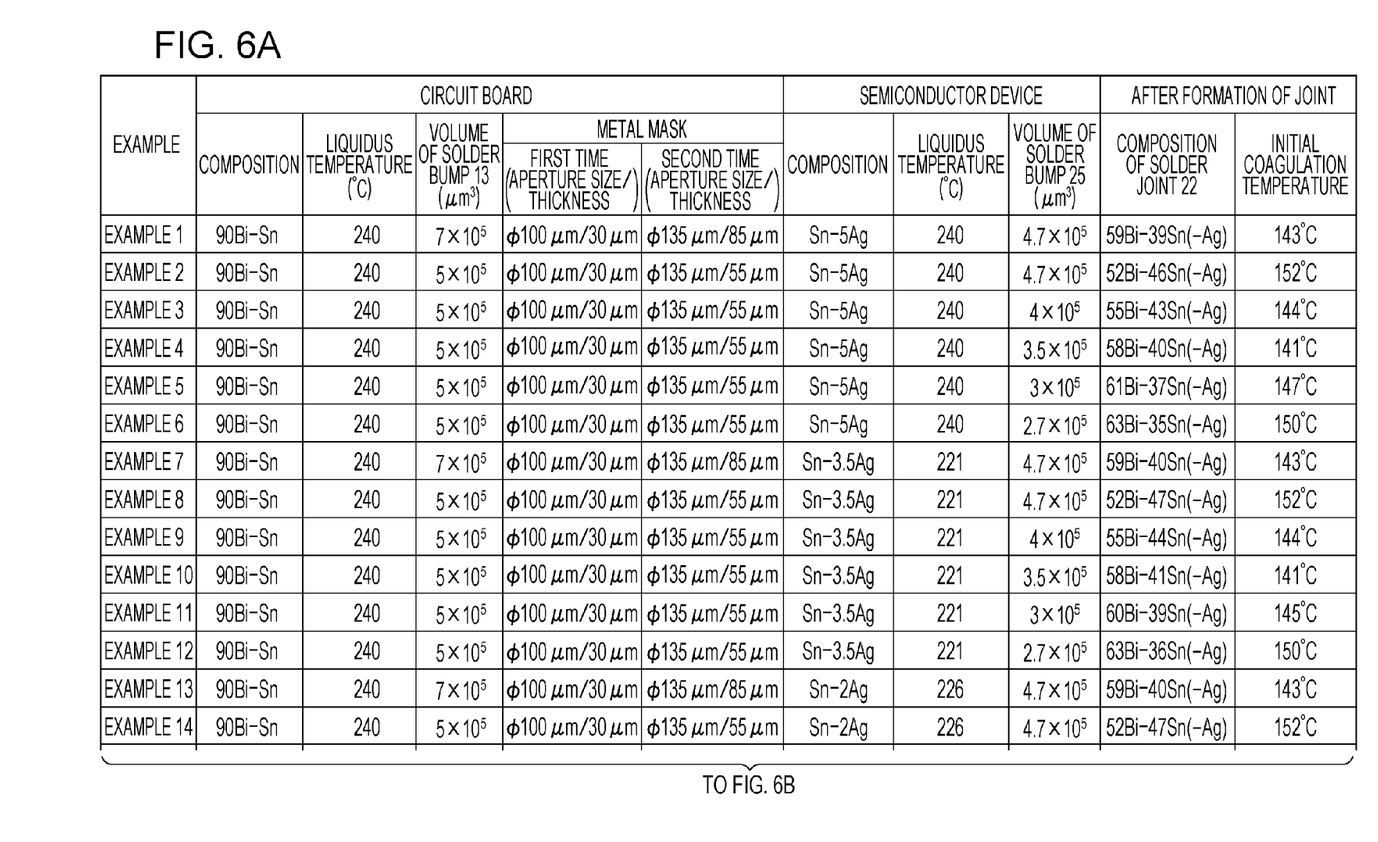
FIGS. 6A and 6B illustrate manufacturing conditions and manufacturing results in accordance with a method of manufacturing semiconductor devices of examples 1 to 31.
Figure 6B:
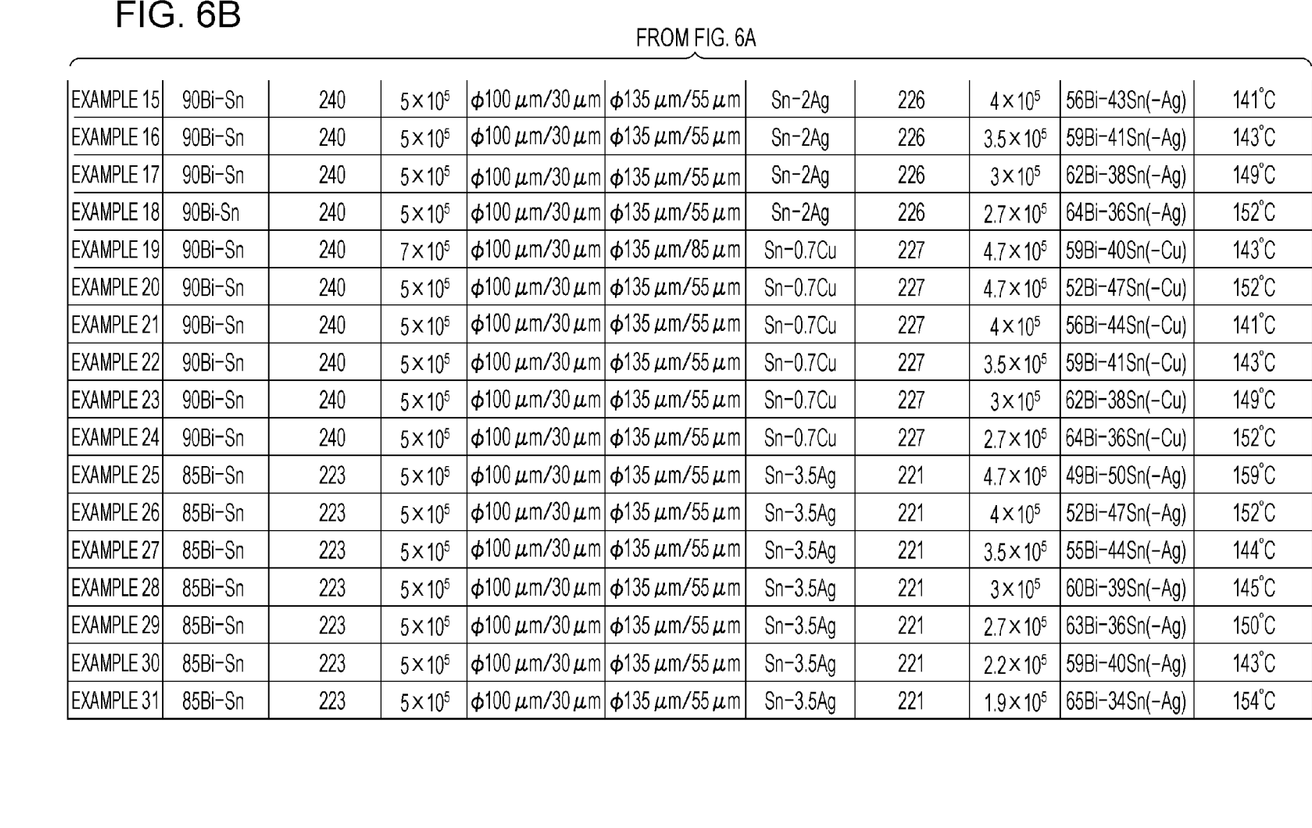
Figure 7:
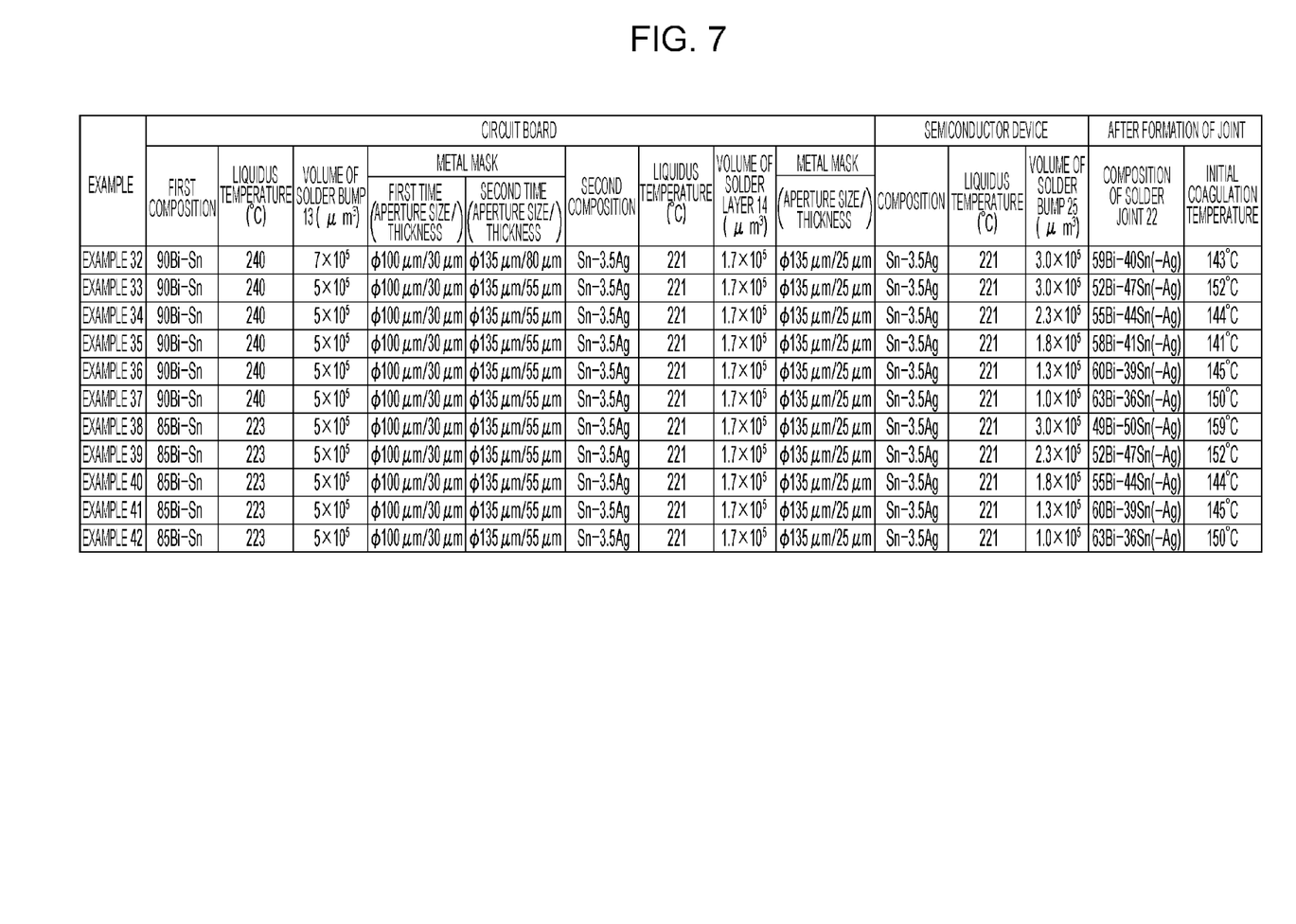
FIG. 7 illustrates manufacturing conditions and manufacturing results in accordance with a method of manufacturing semiconductor devices of examples 32 to 42.

The pattern of the relationship between the composition and volume of the solder bumps 13 provided to the circuit board 11 was changed, and the pattern of the relationship between the composition and volume of the solder bumps 25 formed on the semiconductor chip 24 was changed. FIGS. 6 and 7 each illustrate the results of measuring the compositions and initial solidification temperatures of the solder joints 22 through DSC in such a case.

In examples 2 to 24, as in the case of the example 1, a 90Bi—Sn alloy was used to provide the solder bumps 13 to the circuit board 11, the volume of each of the solder bumps 13 provided to the circuit board 11 was changed, and the composition and volume of each of the solder bumps 25 formed on the semiconductor chip 24 were changed, thereby changing initial solidification temperature. In order to change the volume of each of the solder bumps 13 provided to the circuit board 11, the size of a metal mask that was used to supply the solder paste through printing was changed in some of the examples.

The solder joints 22 were sampled, and the compositions thereof were measured by utilizing ICP. As a result, it was confirmed that the solder joints 22 having compositions illustrated in FIG. 6 were formed.

Examples 25 to 31

In examples 25 to 31, an 85Bi—Sn alloy was used to provide the solder bumps 13 to the circuit board 11, the volume of each of the solder bumps 13 provided to the circuit board 11 was changed, and the composition and volume of each of the solder bumps 25 formed on the semiconductor chip 24 were changed, thereby changing initial solidification temperature. In order to change the volume of each of the solder bumps 13 provided to the circuit board 11, the size of a metal mask that was used to supply the solder paste through printing was changed in some of the examples.

As in the case of the examples 1 to 24, the solder joints 22 were sampled, and the compositions thereof were measured by utilizing ICP. As a result, it was confirmed that the solder joints 22 having compositions illustrated in FIG. 6 were formed.

Example 32

In accordance with the method described in the embodiment 2, a semiconductor device of an example 32 was produced so as to have the configuration of FIG. 3D.

A 90Bi—Sn alloy was used to form the solder bumps 13 in the same manner as employed in the example 1. Then, a metal mask having an aperture size of φ135 μm and having a thickness of 80 μm was used to form the solder layers 14 by a solder paste-printing technique. FIG. 7 illustrates the compositions and volumes of the solder bumps 13, solder layers 14, and solder bumps 25 and illustrates the sizes of metal masks used to supply solder paste through printing. The tops of the solder layers 14 formed on the solder bumps 13 were pressed. Except such configurations, a semiconductor device of the example 32 was manufactured through the same procedures as employed in the example 1.

The solder joints 22 were sampled, and the compositions thereof were measured by utilizing ICP. As a result, it was confirmed that solder joints 22 having compositions illustrated in FIG. 7 were formed.

Examples 33 to 37

Except that the volume of each of the solder bumps 13 provided to the circuit board 11 was changed as illustrated in FIG. 7, the other configurations employed in the example 32 were similarly employed, thereby producing semiconductor devices of the examples 33 to 37.

The solder joints 22 were sampled, and the compositions thereof were measured by utilizing ICP. As a result, it was confirmed that solder joints 22 having compositions illustrated in FIG. 7 were formed.

Examples 38 to 42

Except that the solder bumps 13 were made of an 85Bi—Sn alloy and that the volume of each of the solder bumps 13 provided to the circuit board 11 was changed as illustrated in FIG. 7, the other configurations employed in the example 32 were similarly employed, thereby producing semiconductor devices of the examples 38 to 42.

The solder joints 22 were sampled, and the compositions thereof were measured by utilizing ICP. As a result, it was confirmed that solder joints 22 having compositions illustrated in FIG. 7 were formed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An electronic component mounting board comprising:
   a circuit board;
   an electrode formed on the circuit board;
   a first solder bump formed on the electrode, the first solder bump containing Bi in the range from 85 to 90 wt % as a base component and containing Sn; and
   a solder layer formed on the first solder bump, the solder layer containing Sn having a larger weight ratio than the first solder.

2. The electronic component mounting board according to claim 1, wherein
   the first solder bump further contains at least one metal selected from a group consisting of Au, Ag, Cu, Sb, Ni, Ge, and Zn in the range from 0.01 to 1 wt. %.

3. The electronic component mounting board according to claim 1, wherein
   the solder layer contains Sn higher than or equal to 90 wt. %.

* * * * *